US008610171B2

(12) United States Patent
Bois et al.

(10) Patent No.: US 8,610,171 B2
(45) Date of Patent: Dec. 17, 2013

(54) INFRARED DETECTOR WITH EXTENDED SPECTRAL RESPONSE IN THE VISIBLE FIELD

(75) Inventors: Philippe Bois, Cesson (FR); Olivier Parillaud, Gif sur Yvette (FR); Xavier Marcadet, Palaiseau (FR); Michel Papuchon, Villebon/Yvette (FR)

(73) Assignee: Thales, Neuilly sur Seine (FR)

( * ) Notice: Subject to any disclaimer, the term of this patent is extended or adjusted under 35 U.S.C. 154(b) by 142 days.

(21) Appl. No.: 13/139,238

(22) PCT Filed: Dec. 8, 2009

(86) PCT No.: PCT/EP2009/066632
§ 371 (c)(1),
(2), (4) Date: Jun. 10, 2011

(87) PCT Pub. No.: WO2010/066735
PCT Pub. Date: Jun. 17, 2010

(65) Prior Publication Data
US 2011/0248316 A1   Oct. 13, 2011

(30) Foreign Application Priority Data
Dec. 12, 2008   (FR) ...................................... 08 06997

(51) Int. Cl.
*H01L 31/072*   (2012.01)
*H01L 31/109*   (2006.01)
*H01L 31/0328*   (2006.01)
*H01L 31/0336*   (2006.01)

(52) U.S. Cl.
USPC ............................................. 257/189; 438/94

(58) Field of Classification Search
USPC ............................ 257/189, E31.061; 438/94
See application file for complete search history.

(56) References Cited

U.S. PATENT DOCUMENTS 6,740,908 B1 *   5/2004   Giboney ...................... 257/185

OTHER PUBLICATIONS

"Handbook of Photonics", 1997, Mool C. Gupta, CRC Press LLC, Boca Raton, Florida, USA. ISBN 0-8493-8909-7, XP002548459, p. 18, line 33.
Andreev I A et al.: "Ultrafast GAINASSB P-I-N Photodiode for the Spectral Interval 1.5-2.3 M", Soviet Technical Physics. New York, US, vol. 15, No. 4, Apr. 1, 1989, p. 253/254, XP000102642, the whole document.

* cited by examiner

*Primary Examiner* — Phuc Dang
(74) *Attorney, Agent, or Firm* — Baker & Hostetler LLP

(57) ABSTRACT

A semiconductor-based SWIR infrared detector sensitive to wavelengths shorter than about 2.5 microns comprises a stack of semiconductor layers based on III-V materials forming a PIN photodiode. The stack includes a naked electrical contact, called a lower electrical contact, serving as an optical window; and a detection layer sensitive to said wavelengths. The lower contact comprises at least one layer of indirect-bandgap III-V material(s) doped n-type, pseudomorphic or lattice matched with a substrate intended to serve as a temporary substrate possibly being made of a III-V material such as InP or GaAs or of silicon or germanium.

16 Claims, 4 Drawing Sheets

INFRARED DETECTOR WITH EXTENDED SPECTRAL RESPONSE IN THE VISIBLE FIELD

CROSS-REFERENCE TO RELATED APPLICATIONS

This application is a National Stage of International patent application PCT/EP2009/066632, filed on Dec. 8, 2009, which claims priority to foreign French patent application No. FR 08 06997, filed on Dec. 12, 2008, the disclosures of which are incorporated by reference in their entirety.

FIELD OF THE INVENTION

The field of the invention is that of infrared detectors and more particularly that of multiple-quantum-well infrared detector matrices, notably designed for use in optronic systems.

The invention more precisely relates to PIN-diode photodetectors that detect in the SWIR (short wavelength infrared) range, typically at wavelengths shorter than about 2.5 μm.

Conventionally the various ranges of infrared detection are defined as follows: there are detectors that detect in the SWIR range, those that detect in the MWIR (middle wavelength infrared) range, from 3 to 5 μm, and those that detect in the LWIR (long wavelength infrared) range, at wavelengths from 8 to 12 μm.

Infrared detectors are currently available comprising PIN photodiodes intended for detecting SWIR infrared, possibly comprising one undoped active layer of $In_{1-x}Ga_xAs$ contacted by two layers of InP, respectively doped n- and p-type.

More particularly, PIN diodes having HgCdTe or $In_{0.47}Ga_{0.53}$ active layers have already been provided for detection in this wavelength range, for which detectors the bandgap intrinsically defines the cut-off wavelength $\lambda_c$. These detectors do not have a cut-on voltage and will therefore detect all of the electromagnetic spectrum beneath $\lambda_c$, and in particular visible light.

The invention relates to the extension of the wavelength range at which these detectors detect, which range is generally limited by the bandgap of the active layer ($\lambda_{cut-off}$) and by the absorption of the substrate and/or of the residual window layer ($\lambda_{cut-on}$).

BACKGROUND OF THE INVENTION

Generally, PIN-diode infrared detectors are detector matrices, hybridized with a multiplexed silicon read circuit, which require back-lighting through the lower contact layer.

The lower contact layer (generally an n-type doped semiconductor layer) is a layer said to be a window to the SWIR radiation to be detected but that absorbs visible light, thus attenuating part of the incident flux which could otherwise be absorbed in the working layer of the diode (undoped region).

In general, the various materials used are direct-bandgap semiconductors, with absorption coefficients much higher than $10^4$ cm$^{-1}$ in this part of the spectrum.

Typically, for an InP-based PIN diode, at an operating wavelength of λ=0.6 μm, the value of the absorption coefficient is $6.7 \times 10^4$ cm$^{-1}$. This considerably limits the radiation incident on the active region. This is because the thickness of this layer must be enough to ensure a uniform contact (typically this thickness must be greater than at least about 300 nm), thereby already causing an 86% attenuation.

FIG. 1a shows a diagram of a very generic PIN diode and FIG. 1b illustrates a prior-art PIN diode made of GaInAs/InP.

Generally, an active region 13 made of undoped semiconductor is inserted between an n-type doped semiconductor layer 12 and a p-type doped semiconductor layer 14, the array being integrated between a lower electrode 11 and an upper electrode 15.

An exemplary structure is illustrated in FIG. 1b. A backside electrode 21 bears a substrate 221 made of n$^+$-type doped InP covered with a layer 222 of n$^+$-type doped InP. The active detection layer 23 is made of InGaAs. The active layer is covered by a layer 24 made of p$^+$-type doped (Zn) InGaAs. A Ti/Au contact 25 is produced on this p$^+$-type doped layer. Exemplary dimensions are shown in this FIG. 1b.

One solution currently employed to produce this type of infrared detector consists in, on the one hand, removing the substrate, and on the other hand, above all, limiting the thickness of a part of the contact layer.

Because of the electrical function of this contact layer it is not possible to thin it sufficiently, because a uniform contact must be ensured. For a "reasonable" thickness of about 200 nm, the attenuation is already 74% in a material such as InP at 0.6 μm. In practice, the quantum efficiency of an optimized GaInAs/InP photodiode is 85% in the SWIR and only 30% at 0.6 μm and it approaches 0 at 450 nm.

In this respect, FIG. 2 illustrates the spectral response of an exemplary Goodrich detector. The curve 2a shows the response of a detector extending into the visible range, the curve 2b shows the response of the standard detector in the SWIR range.

SUMMARY OF THE INVENTION

To notably limit the absorption effect of the lower contact layer in the visible range, a source of reduced detector performance due to the reduction in the part of the incident flux that can be absorbed by the sensitive layer, it is proposed, in the present invention, to produce an electrical contact from an indirect-bandgap material, thus advantageously replacing the lower electrical contact made of a direct-bandgap material currently used in infrared detectors in the SWIR range.

In the family of semiconductor materials, the concept of direct and indirect bandgaps is connected to the representation of energy dispersion in the semiconductor material concerned, giving the energy E diagram as a function of the wavevector k. This diagram allows the extrema of the conduction and valence bands to be defined spatially. These extrema represent, in a semiconductor material, energy bands in which the density of p-type carriers, for the valence band, and n-type carriers, for the conduction band, is high.

Direct-bandgap semiconductors are spoken of, for a semiconductor, when the valence band maximum and the conduction band minimum are located at a neighboring value of the wavevector k in the E(k) diagram.

An indirect-bandgap semiconductor material is spoken of, for a semiconductor, when the valence band maximum and the conduction band minimum have separate wavevector k values on the E(k) diagram.

It should be noted that most materials from columns III and V of the Periodic table of the chemical elements are direct-bandgap materials whereas silicon, belonging to column IV of the Periodic table of the chemical elements, has an indirect bandgap.

More precisely, one subject of the present invention is a semiconductor-based SWIR infrared detector sensitive to wavelengths shorter than about 2.5 microns comprising a stack of semiconductor layers based on III-V materials forming a PIN photodiode, said stack comprising at least:

a naked electrical contact, called a lower electrical contact, serving as an optical window; and a detection layer sensitive to said wavelengths; characterized in that the so-called lower contact comprises at least one layer of indirect-bandgap III-V material(s) doped n-type, pseudomorphic or lattice matched with a substrate intended to serve as a temporary substrate possibly being made of a III-V material such as InP or GaAs or of silicon or germanium.

According to one variant of the invention, the detection layer is made of GaInAs.

According to another variant of the invention, the so-called lower contact comprises an (Al,As,Sb)-based alloy.

According to another variant of the invention, the so-called lower contact comprises an $AlAs_{0.563}Sb_{0.437}$ alloy.

According to another variant of the invention, the so-called lower contact comprises at least one alternation of (Al,Ga)AsSb/(AlGa)InAs layers or more precisely $Al_xGa_{1-x}As_ySb_{1-y}/(Al_yGa_{1-y})_{1-z}In_zAs$ layers. According to a variant of the invention, the alternation of layers forming the so-called lower contact comprises at least about ten pairs of (Al,Ga)AsSb ($Al_xGa_{1-x}As_ySb_{1-y}$) and (AlGa)InAs (($Al_yGa_{1-y})_{1-z}In_zAs$) layers.

According to another variant of the invention, the infrared detector furthermore comprises a layer for matching the conduction bands of the so-called lower contact and the sensitive layer.

According to another variant of the invention, the matching layer comprises a set of elementary matching layers comprising an alternation of (Al,Ga)AsSb/(Al,Ga)InAs layers.

According to another variant of the invention, the detection layer is made of GaAs ($\lambda$<850 nm). According to another variant of the invention, the detection layer is made of InP ($\lambda$<920 nm).

According to another variant of the invention, the so-called lower contact comprises at least one layer of $Al_xGa_{1-x}As$ alloy with x lying between 0.42 and 1.

Another subject of the invention is a fabrication process for fabricating an SWIR infrared detector according to the invention, characterized in that it comprises the following steps:
  producing on the surface of an InP substrate, an electrical contact, called a lower contact, comprising at least one layer having an indirect bandgap;
  producing a detection layer on the surface of the so-called lower electrical contact;
  producing a layer of p-type doped semiconductor material and an electrical contact, called the upper contact; and
  removing said substrate from the stack produced beforehand.

BRIEF DESCRIPTION OF THE DRAWINGS

The invention will be better understood and other advantages will become clear on reading the following nonlimiting description and by virtue of the appended figures among which.

DETAILED DESCRIPTION

Generally, the infrared detector of the present invention comprises a so-called lower electrical contact, serving as a window to the radiation to be detected. This contact comprises layers formed, either completely or partially, of an indirect-bandgap material, with a view to reducing their coefficient of absorption in the visible.

This is because the efficiency of optical transitions in an indirect-bandgap semiconductor is lower than in direct-bandgap semiconductors, if only the sub-UV spectrum is concerned.

By way of example, for direct-bandgap semiconductor materials such as InP or GaAs the absorption coefficient is respectively $6.7 \times 10^4$ cm$^{-1}$ and $4.7 \times 10^4$ cm$^{-1}$ at 0.6 μm, whereas this coefficient is equal to $4 \times 10^3$ cm$^{-1}$ for silicon, an indirect-bandgap semiconductor material.

Figure 1A:
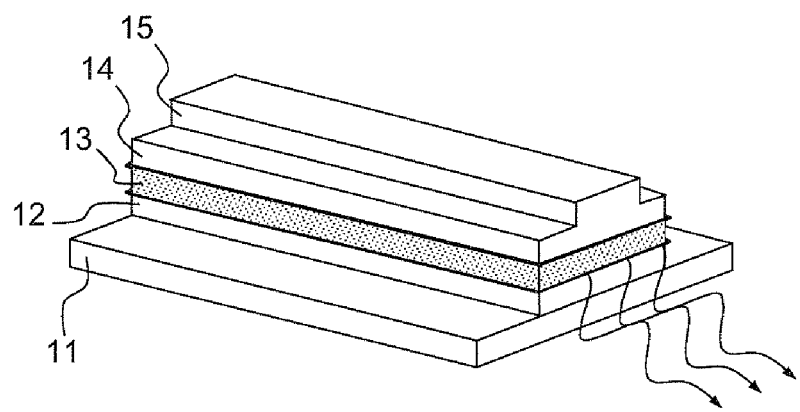
FIGS. 1a and 1b illustrate a generic diagram of a PIN diode and that of a prior-art GaInAs/InP diode.
Figure 1B:
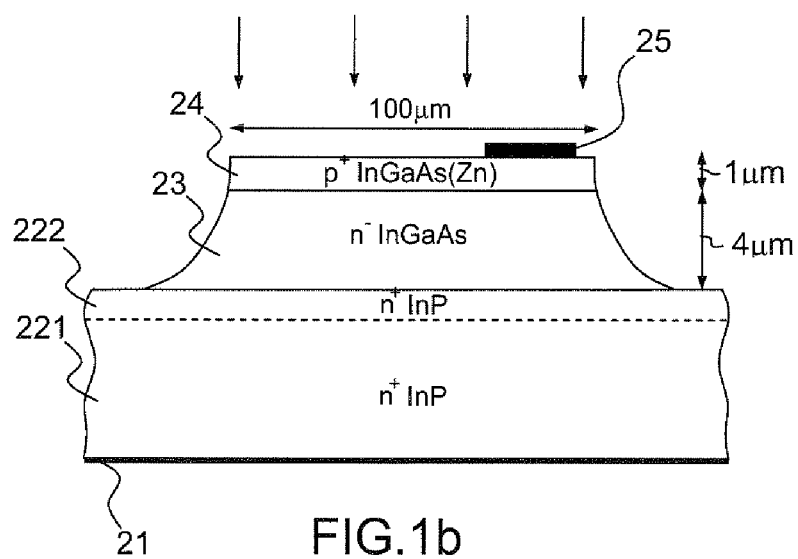
Figure 2:
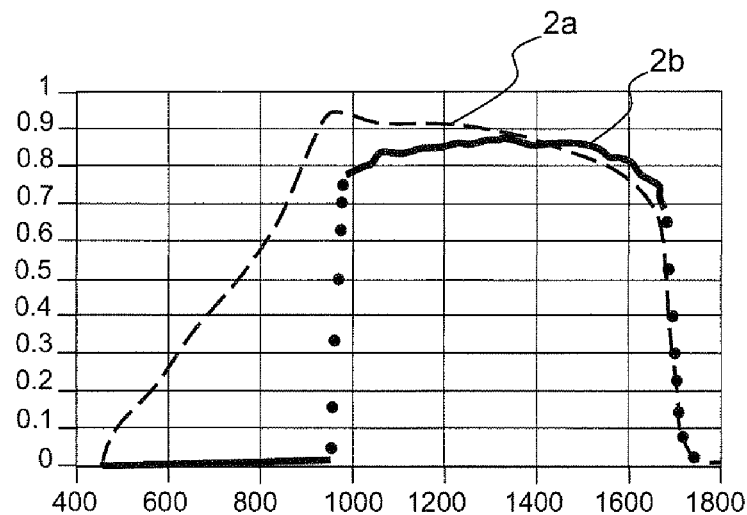
FIG. 2 illustrates the spectral response of a prior-art Goodrich detector corresponding to the structure illustrated in FIG. 1b.
Figure 3:
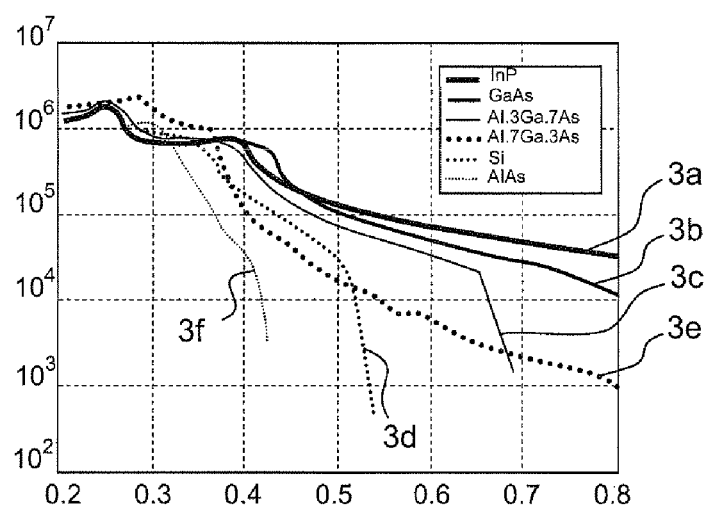
FIG. 3 illustrates the variation of the absorption as a function of the wavelength for various semiconductor materials: InP, GaAs, (direct bandgap) $Al_{0.3}Ga_{0.7}As$ and Si, AlAs and Si, AlAs and (indirect bandgap) $Al_{0.7}Ga_{0.3}As$.

FIG. 3 illustrates the variation in absorption as a function of the wavelength for various semiconductor materials: InP, GaAs, direct bandgap $Al_{0.3}Ga_{0.7}As$ (solid lines 3a, 3b, 3c) and Si, AlAs and indirect bandgap $Al_{0.7}Ga_{0.3}As$ (dotted lines 3d, 3e, 3f).

Exemplary Embodiment of an IR Detector Operating in the SWIR Range

The infrared detector is produced on an InP substrate comprising at least the contact called the lower contact, the layer sensitive to the radiation to be detected and a semiconductor layer doped p-type and a contact called the upper contact.

The substrate is removed in a second step, so as to leave the so-called lower contact, intended to serve as an optical window, naked.

In the column of the III-V materials, certain materials have an indirect bandgap and are lattice matched to an InP substrate, so as to guarantee a stress-free material and/or a defect density compatible with the fabrication of multi-element detector matrices (typically comprising at least 100,000 pixels).

Among these materials there is notably $AlAs_{0.563}Sb_{0.437}$; for metallurgical reasons it is easier to grow a "pseudo-alloy" (Al,Ga)AsSb/(Al,Ga)InAs than the bulk material AlAsSb; to match the conduction bands of the contact layer and the active layer it is also possible to use a graded "pseudo-alloy" layer of (Al,Ga)AsSb/(Al,Ga)InAs, which ensures the same function as that of a standard GaInAsP matching layer.

Figure 4:
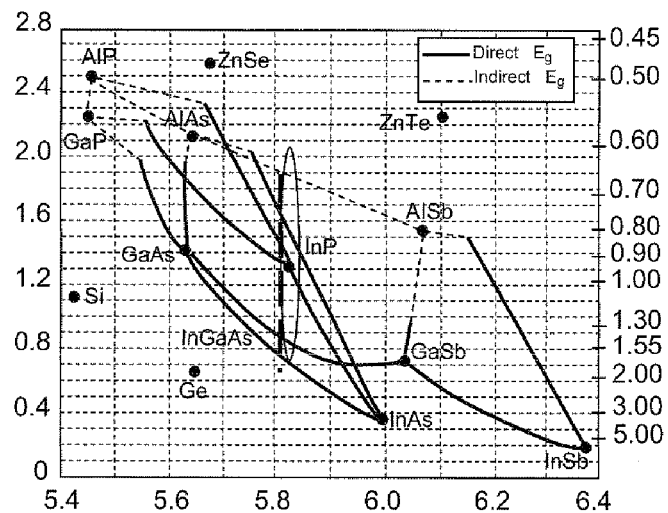
FIG. 4 illustrates the bandgap as a function of the lattice parameter for various semiconductor alloys likely to be used in an infrared detector according to the invention.

FIG. 4 illustrates the variation of the bandgap between the valence band and the conduction band as a function of the lattice parameter for various III-V semiconductor materials.

According to a variant of the invention, it is thus proposed to produce pseudo-alloys using supergratings formed from layers of AlAsSb and GaInAs, lattice matched to the InP substrate, by varying the relative proportion of the two materials so as to reproduce the standard band profile.

These supergratings have either a direct bandgap or an indirect bandgap depending on their composition.

A contact layer results, of which only a part has a direct bandgap, thereby leading to a reduction in its overall absorption coefficient.

Figure 5:
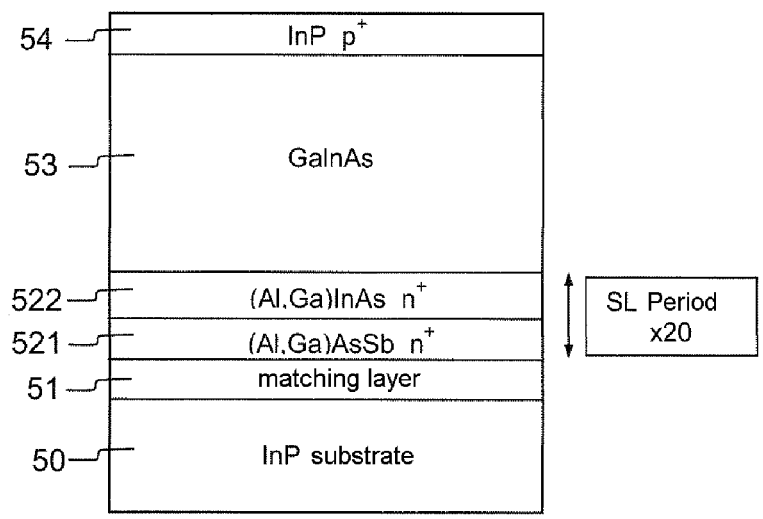
FIG. 5 illustrates a diagram of an AlAsSb/InGaAs supergrating forming a lower electrical contact lattice matched with an InP substrate according to the invention.

FIG. 5 shows a diagram of an AlAsSb/InGaAs supergrating lattice matched to InP used in this exemplary detector according to the invention.

On a substrate 50 made of InP, an intermediate layer 51, called a matching layer, made of GaInAsP, is produced. On the surface of this layer the structure SL, called the supergrating, is produced comprising an alternation of pairs, 521 and 522, of layers made of (Al,Ga)AsSb and of (Al,Ga)InAs, the structure SL typically comprising about twenty layer pairs, the total thickness of the so-called supergrating structure being about 330 nm. On the surface of this structure the active layer 53 made of GaInAs is formed, followed by the upper contact layer 54 made of p$^+$-type doped InP.

In order to obtain a pseudo-alloy having an indirect bandgap, the GaInAsP matching layer may be replaced by (Al,Ga)InAs. The thicknesses of the wells and barriers will be adjusted so as to obtain a pseudo-alloy and not the two-material stack.

To match the conduction bands of the contact layer and the active layer, the compositions of the layers may be modified from period to period.

Figure 6:
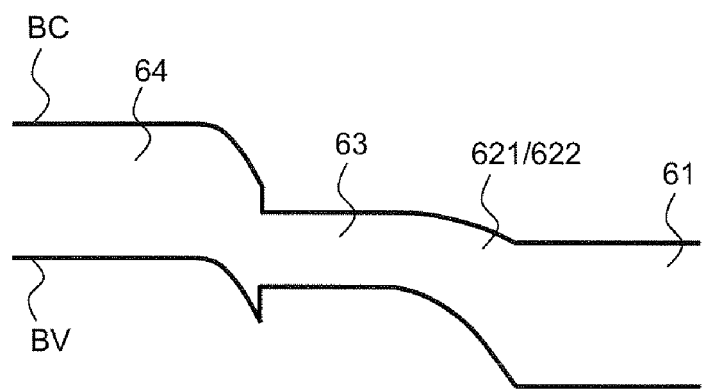
FIG. 6 illustrates a band diagram for an SWIR diode according to the invention.

FIG. 6 shows a diagram of the conduction band BC and valence band BV of an exemplary SWIR detector comprising respectively an n-type doped InP substrate 60, a supergrating structure 621/622 based on n-type doped AlGaInAsSb, an undoped GaInAs active layer 63 and a p-type doped InP upper layer 64.

It is enough, after the growth and fabrication of a matrix and after assembly of a focal plane (the focal plane being defined in a known way by the hybrid assembly formed by a matrix of pixels and a multiplexer or silicon read circuit), to remove the InP substrate to obtain an SWIR focal plane the quantum efficiency of which is preserved into the visible wavelength range (i.e. down to approximately 0.4 µm).

Figure 7:
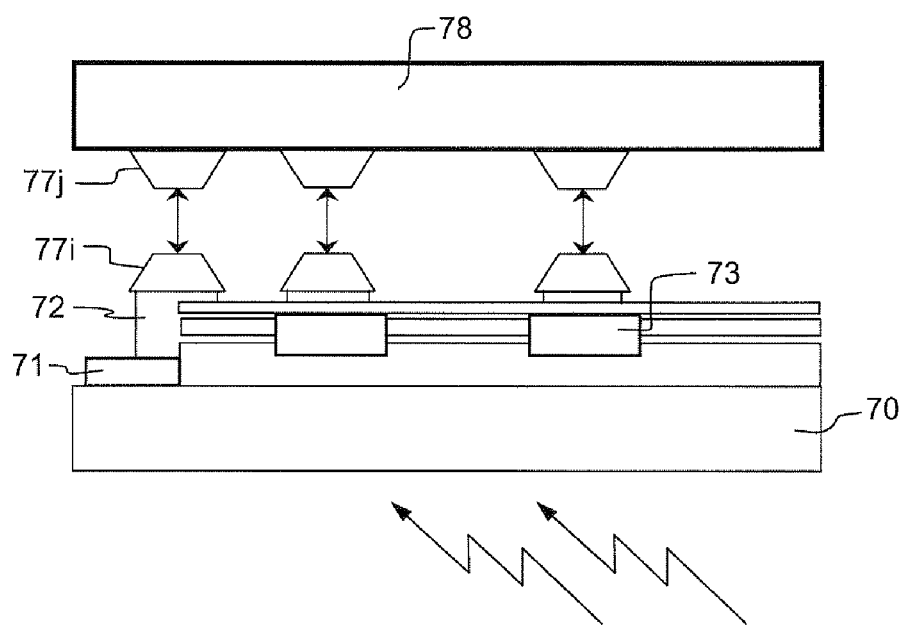
FIG. 7 illustrates an exemplary detection focal plane according to the invention.

FIG. 7 shows an exemplary embodiment of such a hybrid assembly forming a detection focal plane.

As is known, an InP substrate 70 bears the active pixels 73 identical to those described in FIG. 5, via contacts (not shown) and are joined to a read matrix 78 by way of indium bumps $77_i$ and $77_j$. The n-type contact is given the reference 71 and may advantageously be connected to an indium bump via a metallic element 72.

Exemplary Infrared Detector Functioning in the NIR Range (Cut-Off Wavelength $\lambda_c \approx 0.9$ µm)

The infrared detector comprises a sensitive layer made of InP or GaAs.

In the case of a detector on an InP substrate the so-called lower contact is advantageously made of an indirect-bandgap material of the (AlGaIn)(AsSb) type described above in the invention.

In the case of a detector on a GaAs substrate the so-called lower contact is advantageously made of an indirect-bandgap material of the $Al_xGa_{1-x}As$ type, where x lies between 0.42 and 1. For lower molar fractions the alloy is a direct-bandgap material which absorbs too strongly.

The invention claimed is:

1. A semiconductor-based short wavelength infrared (SWIR) infrared detector sensitive to wavelengths shorter than 2.5 microns comprising:
a stack of semiconductor layers based on III-V materials forming a PIN photodiode, said stack comprising:
a naked electrical contact, being a lower electrical contact, serving as an optical window; and
a detection layer sensitive to said wavelengths,
wherein the lower electrical contact comprises at least one layer of indirect-bandgap III-V material(s) doped n-type, pseudomorphic or lattice matched with a substrate made of a III-V material comprising InP or GaAs or of silicon or germanium.

2. The infrared detector according to claim 1, wherein the detection layer is made of GaInAs.

3. The infrared detector according to claim 2, wherein the lower electrical contact comprises an (Al,As,Sb)-based alloy.

4. The infrared detector according to claim 2, wherein the lower electrical contact comprises an $AlAs_{0.563}Sb_{0.437}$ alloy.

5. The infrared detector according to claim 3, wherein the lower electrical contact comprises at least one alternation of (Al,Ga)AsSb/(AlGa)InAs layers.

6. The infrared detector according to claim 5, wherein the alternation of layers comprises at least about ten pairs of (Al,Ga)AsSb and (AlGa)InAs layers.

7. The infrared detector according to claim 1, further comprising:
a layer for matching conduction bands of the lower electrical contact and the sensitive layer.

8. The infrared detector according to claim 7, wherein the matching layer comprises a set of elementary matching layers comprising an alternation of (Al,Ga)AsSb/(Al,Ga)InAs layers.

9. The infrared detector according to claim 1, wherein the detection layer is made of GaAs.

10. The infrared detector according to claim 1, wherein the detection layer is made of InP.

11. The infrared detector according to claim 9, wherein the lower electrical contact comprises at least one layer of $Al_xGa_{1-x}As$ alloy with x lying between 0.42 and 1.

12. The infrared detector according to claim 10, wherein the lower electrical contact comprises an (Al,As,Sb)-based alloy.

13. The infrared detector according to claim 10, wherein the lower electrical contact comprises an $AlAs_{0.563}Sb_{0.437}$ alloy.

14. The infrared detector according to claim 10, wherein the so-called lower electrical contact comprises at least one alternation of (Al,Ga)AsSb/(AlGa)InAs layers.

15. The infrared detector according to claim 10, wherein the lower electrical contact comprises at least about ten pairs of (Al,Ga)AsSb and (AlGa)InAs layers.

16. A fabrication process for fabricating an SWIR infrared detector according to claim 1 comprising:
producing, on the surface of an InP substrate, the lower electrical contact;
producing the detection layer on the surface of the lower electrical contact;
producing a p-type doped upper layer made of a III-V semiconductor and a contact, called the upper contact; and
removing said substrate from the stack produced beforehand.

* * * * *